United States Patent
Bruccoleri et al.

(10) Patent No.: US 6,654,192 B1
(45) Date of Patent: Nov. 25, 2003

(54) HIGH FREQUENCY TRACK AND HOLD FULL-WAVE RECTIFIER

(75) Inventors: Melchiorre Bruccoleri, Rho (IT); Daniele Ottini, Pavia (IT); Marco Demicheli, Binago (IT); Giacomino Bollati, Castel San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/294,642

(22) Filed: Apr. 19, 1999

(30) Foreign Application Priority Data

Apr. 23, 1998 (EP) .............................. 98830246

(51) Int. Cl.[7] .................................. G11B 5/09

(52) U.S. Cl. ........................................ 360/46

(58) Field of Search ................. 360/46, 51, 77.05, 360/77.08, 29, 32, 77.01, 78.01; 327/161, 263, 96, 306

(56) References Cited

U.S. PATENT DOCUMENTS

| | | | | |
|---|---|---|---|---|
| 4,373,141 A | | 2/1983 | Sanders ...................... 307/351 |
| 5,301,072 A | * | 4/1994 | Wilson ................. 360/77.08 X |
| 5,483,393 A | * | 1/1996 | Mento et al. ............ 360/77.08 |
| 5,517,141 A | * | 5/1996 | Abdi et al. .................. 327/306 |
| 5,583,713 A | | 12/1996 | Real et al. ................ 360/77.08 |
| 6,208,184 B1 | * | 3/2001 | Demicheli et al. .......... 327/161 |

OTHER PUBLICATIONS

Texas Instruments application report for TRF3040 Frequency Modulator/Synthesizer Jun. 1999.*

Steyart, M.S., A CMOS Rectifier–Integrator for Ammplitude Detection in Hard Disk Servo Loops, IEEE Journal of Solid–State Circuits, vol. 30, No. 7, Jul. 1995, pp. 743–751.

* cited by examiner

Primary Examiner—David Hudspeth
Assistant Examiner—K. Wong
(74) Attorney, Agent, or Firm—Lisa K. Jorgenson; Allen, Dyer, Dopplet, Milbrath & Gilchrist, P.A.

(57) ABSTRACT

A full-wave rectifier for monitoring the amplitude of a differential analog signal includes a differential Track&Hold stage controlled by a first differential logic timing signal tracking the differential analog input signal during a tracking phase that corresponds to a high logic stage of the first differential timing signal. This produces a differential output signal that is a replica of the input signal and the signal is stored during a successive storing phase that corresponds to a low logic state of the first differential timing signal. A first differential output amplifier includes inputs coupled to the output of the Track&Hold stage. A differential bistable circuit, controlled by a second differential logic timing signal, includes inputs coupled to the differential outputs of the first amplifier and produces a third differential logic control signal. A second multiplexed amplifier, controlled by the third differential control signal, includes inputs coupled to the output of the Track&Hold stage and produces a differential analog signal having an amplitude function corresponding to the amplitude of the differential input signal. A timing circuit receives at an input a differential logic synchronizing signal and generates the first differential timing signal of the Track&Hold stage and the second differential timing signal of the bistable circuit.

19 Claims, 9 Drawing Sheets

HIGH FREQUENCY TRACK AND HOLD FULL-WAVE RECTIFIER

FIELD OF THE INVENTION

The present invention relates in general to circuits for processing analog signals, and, more particularly, to a rectifier integrated circuit.

BACKGROUND OF THE INVENTION

In many applications it is necessary to monitor the amplitude of a high frequency signal, i.e., >10 MHz, received at a certain input in order to optimize the signal reception. Frequently, the devices of servo loops that implement the necessary optimization adjustments are digitally controlled. This implies the need for converting an analog signal representative of the amplitude of the high frequency input signal into a digital value.

A typical example of a signal amplitude detector for the control loop of a numerical servo actuator is used to align the read/write heads of a mass memory device, such as a hard disk drive (HDD) of a personal computer. The amplitude of the signals originating from the distinct heads represent a measure of the head alignment on the respective disk tracks. Therefore, the analog signal representing the amplitude of the high frequency signal is fed to an analog/digital converter, whose output is used to control the positioning motor of the heads.

The amplitude of a high frequency signal may be determined using a peak detector. Normally, it uses an operational amplifier to store the maximum level of the input signal on a capacitor. However, due to the relatively high frequency of the signals (>10 MHz), relatively high performance in terms of slew rate is required from the operational amplifier. This often requires unacceptably high power consumption and large size components A further drawback of this approach is the limited noise rejection and the disturbances that eventually cause errors in the output digital stream. A known alternative approach includes detecting the amplitude by rectifying the signal, followed by an integration.

The rejection of noise is noticeably improved because the noise is minimized by the integration. A typical full-wave rectifier and an integrating capacitor are used. The input voltage is converted into a current by the operational amplifier and the current is rectified by a common diode bridge and integrated on the output capacitor However, to obtain an adequate precision, the requirements of pass band and gain (GBW) of the operational amplifier are severe.

The article titled: "A CMOS Rectifier-Integrator for Amplitude Detection in Hard Disk Servo Loops", by Michel S. J. Steyaert, et al.; IEEE Journal of Solid-State Circuits, Vol. 30, No 7, July 1995, describes a rectifier-integrator CMOS circuit for a high frequency signal, particularly suited to act as an amplitude detector in HDD servo loops. Even in this case, the operational amplifier must satisfy the pass band and gain requisites which are particularly demanding. In general, by assuming that a sinusoidal input signal has a frequency $F_0$, the system requires an analog pass band larger than $2*F_0$.

The trend in many applications is to handle higher and higher frequency signals, e.g., >10 MHz originating from HDD heads. This imposes an adjustment in the operating characteristics which generally implies a greater power consumption, and also imposes the need to achieve a high precision which generally requires a relatively large area of integration on silicon.

SUMMARY OF THE INVENTION

Confronted with the aboved described increasing difficulties to meet the requirements of amplitude detector circuits for high frequency signals, a system according to the present invention is based on the use of a so-called Track&Hold circuit (T&H) and on a known bistable circuit commonly known as an ECL latch.

This system is functionally controlled by a dedicated timing circuit that derives appropriate control signals for the T&H and the ECL latch from a master clock signal, and of an analog amplifier multiplexed by way of multiplexing control signals provided by the same bistable circuit. This circuit contains information on the sign of the output signal of the multiplexed analog amplifier to the input of which is fed the signal output by the Track&Hold stage.

The invention is particularly effective, but not exclusively, in servo loops for reading data from disks, typically in hard disk drives (HDD) of personal computers.

DETAILED DESCRIPTION OF THE PREFERRED EMBODIMENTS

The figures and the ensuing description refer to a most frequent embodiment of these processing circuits for differential analog signals as they are preferably used to prevent problems caused by an offset phenomena of the various stages coupled together, as well as to have advantages in terms of reduced harmonics and dynamic distortion.

Figure 7A:
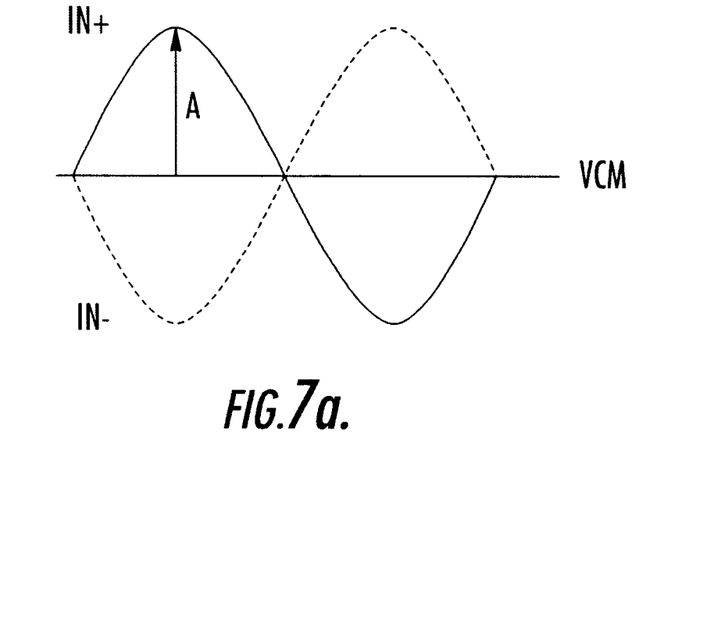
FIGS. 7a, 7b, 8a and 8b illustrate the notations used for the analog differential signals and ECL signals according to the present invention.
Figure 7B:
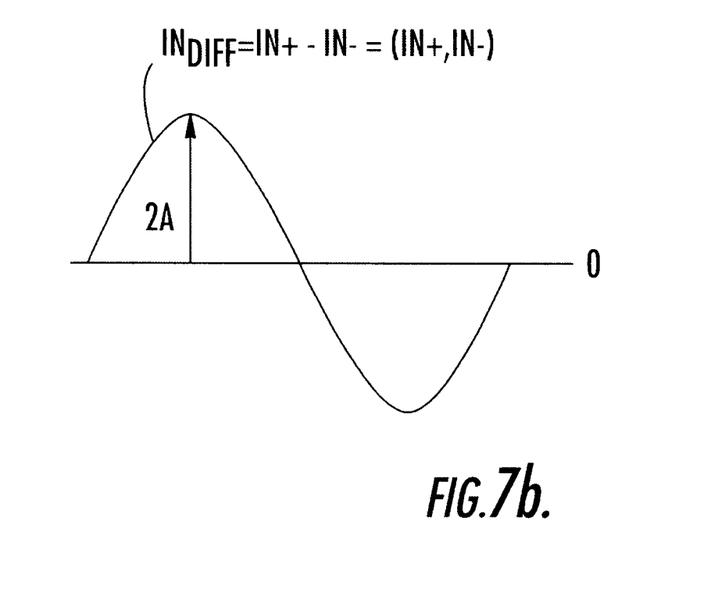
Figure 8A:
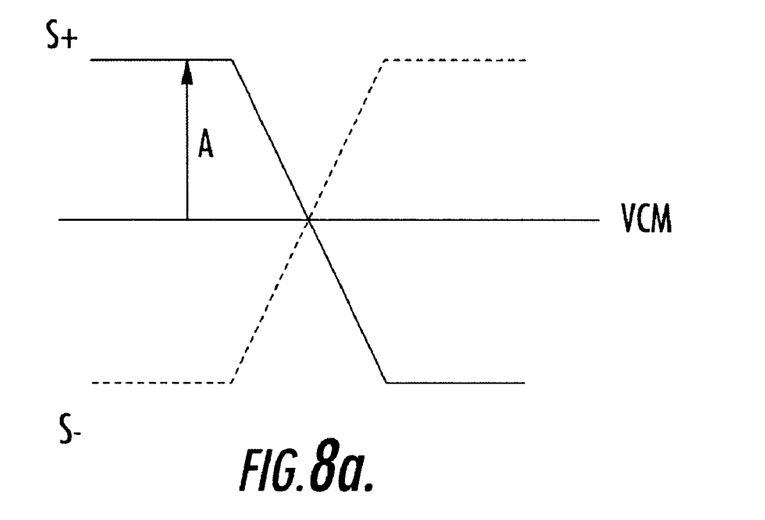
Figure 8B:
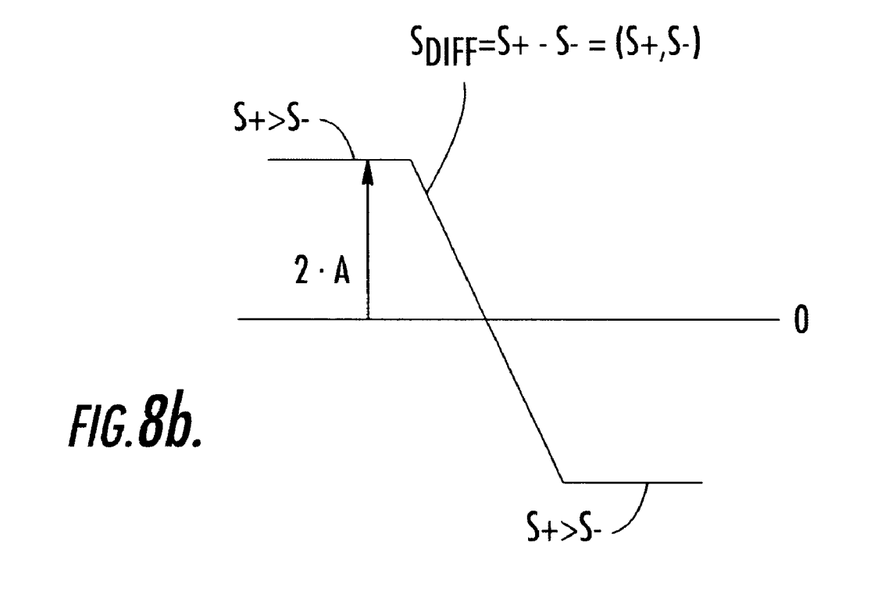

In order to clarify the meaning of the terms and symbols used in the ensuing description, FIG. 7b depicts the analog differential signal (sinusoidal, for example) $IN_{DIFF}$ or (IN+, IN-) that corresponds to the difference between the two single ended signals IN+ and IN- of FIG. 7a. Similarly, FIG. 8b shows the digital ECL differential signal $S_{DIFF}$ or (S+, S-) that corresponds to the difference between the two single ended digital signals S+ and S- of FIG. 8a.

Figure 1:
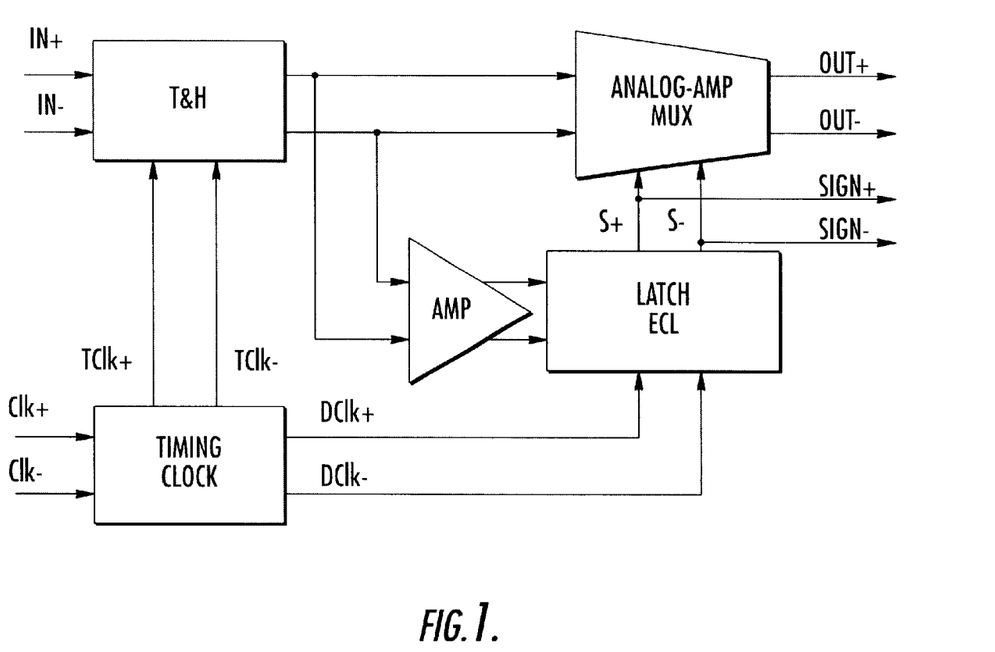
FIG. 1 is a basic scheme of the circuit according to the present invention.
Figure 2:
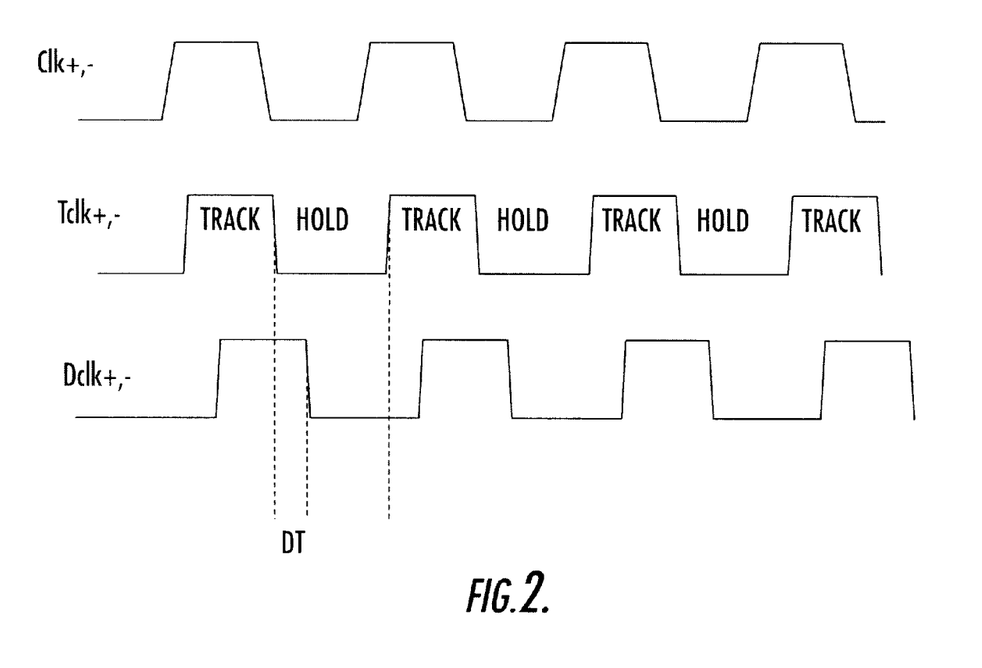
FIG. 2 is a diagram showing waveforms of the timing signals of the various functional blocks of the circuit according to the present invention.

In both examples, while the single ended signals are referred to the common voltage mode VCM, the corresponding differential signals are referred to zero potential, while A and 2 A are the relative signal amplitudes. By referring to the basic scheme of FIG. 1 and to the diagrams showing the timing signals of the different functional blocks that made up the circuit of the invention, as shown in FIG. 2, the system according to the present invention has two fundamental functioning phases: the TRACK phase and the HOLD phase. The TRACK phase of the circuit is defined by a first differential timing signal (TClk+ and TC−) at a high logic level, i.e., TClk+ is high and TClk− is low. The differential analog input signal (IN+, IN−) is tracked and eventually amplified by the Track&Hold stage.

The Amp amplifier, having a nonlinear characteristic, amplifies the signal existing on the differential outputs of the Track&Hold stage to be fed to the bistable stage LATCH-ECL, which functions in a transparent manner when the relative timing differential signal (DClk+, DC−) is at a high level. In these conditions, the differential control signal (S+, S−) existing at the output of the bistable circuit provides, already in this phase of operation, information about the sign of the input signal, and (S+, S−) corresponds to a (At&h*Aamp*Alatch*IN+, At&h*Aamp*Alatch*IN−). That is, (S+, S−)=(IN+, IN)*(At&h*Aamp*Alatch).

If the differential analog input signal (IN+, IN−) is too small, the differential control signal (S+, S−) is in an unresolved zone. That is, the differential signal (S+, S−) in neither at a proper logic high level (2 A) nor at a proper logic low level (−2 A), and therefore the multiplexed differential amplifier Analog-Amp MUX cannot carry out its function which may be defined as follows: If the differential control signal (S+, S−) is at a high level, the differential analog output signal (OUT+, OUT−) is equivalent to (Ath*AanalogMUX*IN+, Ath*AanalogMUX*IN−). If (S+, S−) is at a low level, (OUT+, OUT−) is equivalent to (Ath*AanalogMUX*IN+, Ath*AanalogMUX*IN−).

For the HOLD Phase (Storing) of operation, the differential timing signal (TClk+, TC−) is at a low level. That is, TCLk+is low and TClk− is high. The Track&Hold circuit (T&H) stores the differential signal existing at its output which, amplified by the Amp stage, is also present at the input of the bistable LATCH-ECL circuit. The latch, after a delay interval of time (DT), sees its own differential timing signal (DClk+, DC−) reach a low level and therefore the circuit LATCH-ELC is forced into a regenerative functioning mode. This sets the differential timing signal (S+, S−) that corresponds to the differential signal (IN+, IN−)*(At&h*Aamp*exp(for the time interval wherein (DClk+, DC−) is at a low level/K)), wherein K is a constant that depends on the particular implementation of the circuit.

Figure 3:
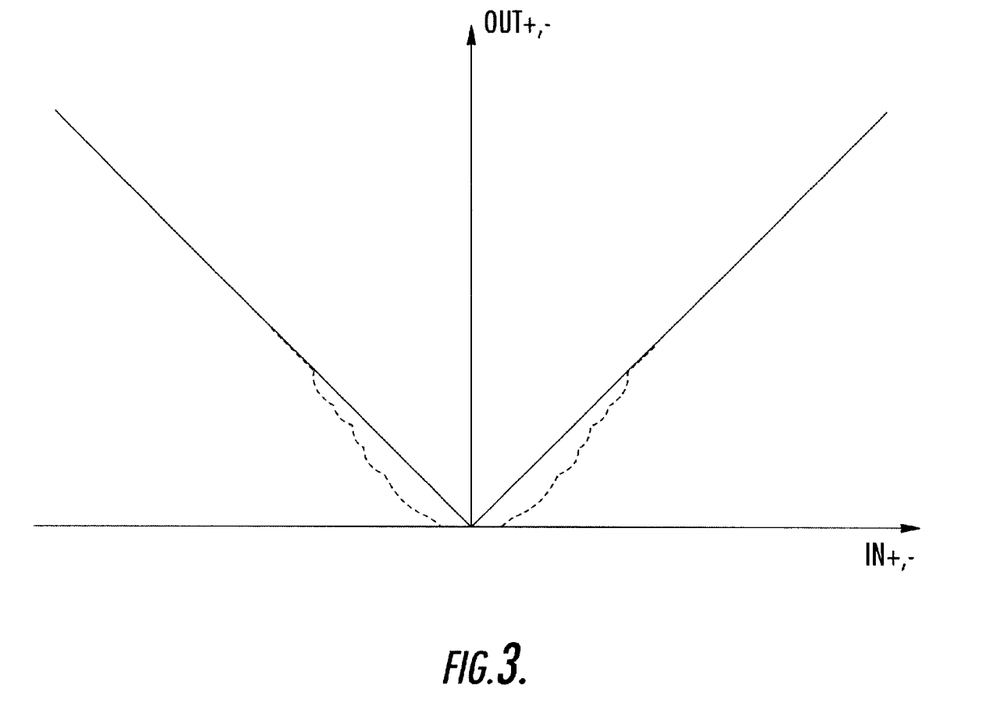
FIG. 3 compares the characteristics of the amplitude detector of the present invention with those of a detector of the prior art.

In this way, the differential control signal (S+, S−) provides an ECL signal for a correct functioning of the differential amplifier Analog-Amp MUX. Essentially, the system carries out a MODULUS function, i.e., extraction of the amplitude value on a sampled signal without being subject to recurrent errors on the profile of the MODULUS function (amplitude), about the point of discontinuity for small input signals as represented by the broken line characteristic in the diagrams of FIG. 3.

A further advantage of the system of the invention is that is allows for a conspicuous reduction of the pass band requisite of the amplifiers: AMP and Analog-Amp MUX, and requires a band pass of the Track&Hold stage merely sufficient to correctly sample the differential analog input signal (IN+, IN−). As a consequential benefit, there is a conspicuous reduction of power consumption and because of the very high gain intrinsically possessed by the bistable circuit LATCH-ELC during the Hold phase, a modulus function of practically ideal characteristics is implemented.

Figure 4:
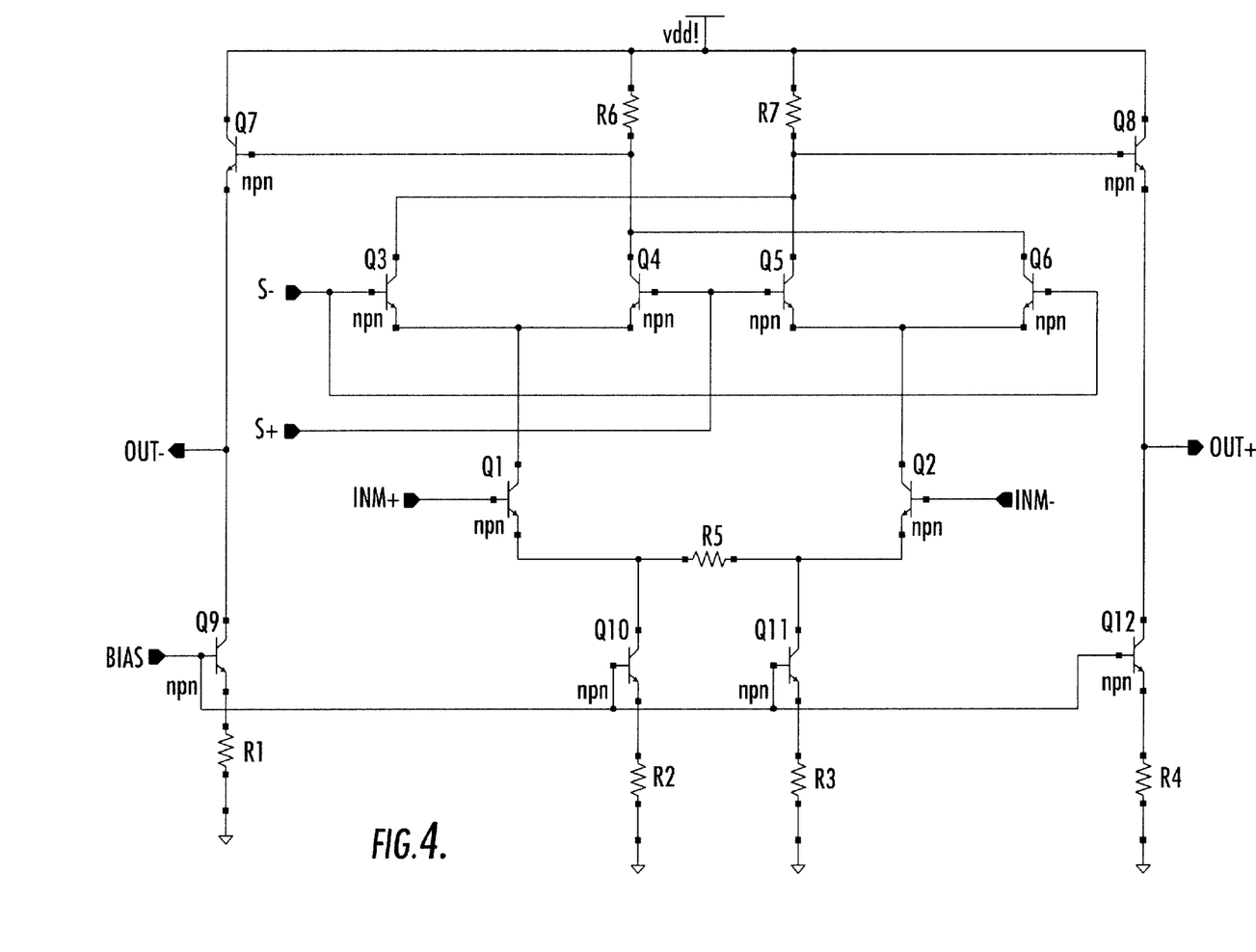
FIG. 4 shows a circuit diagram of a multiplexed differential amplifier used in the circuit according to the present invention.
Figure 5:
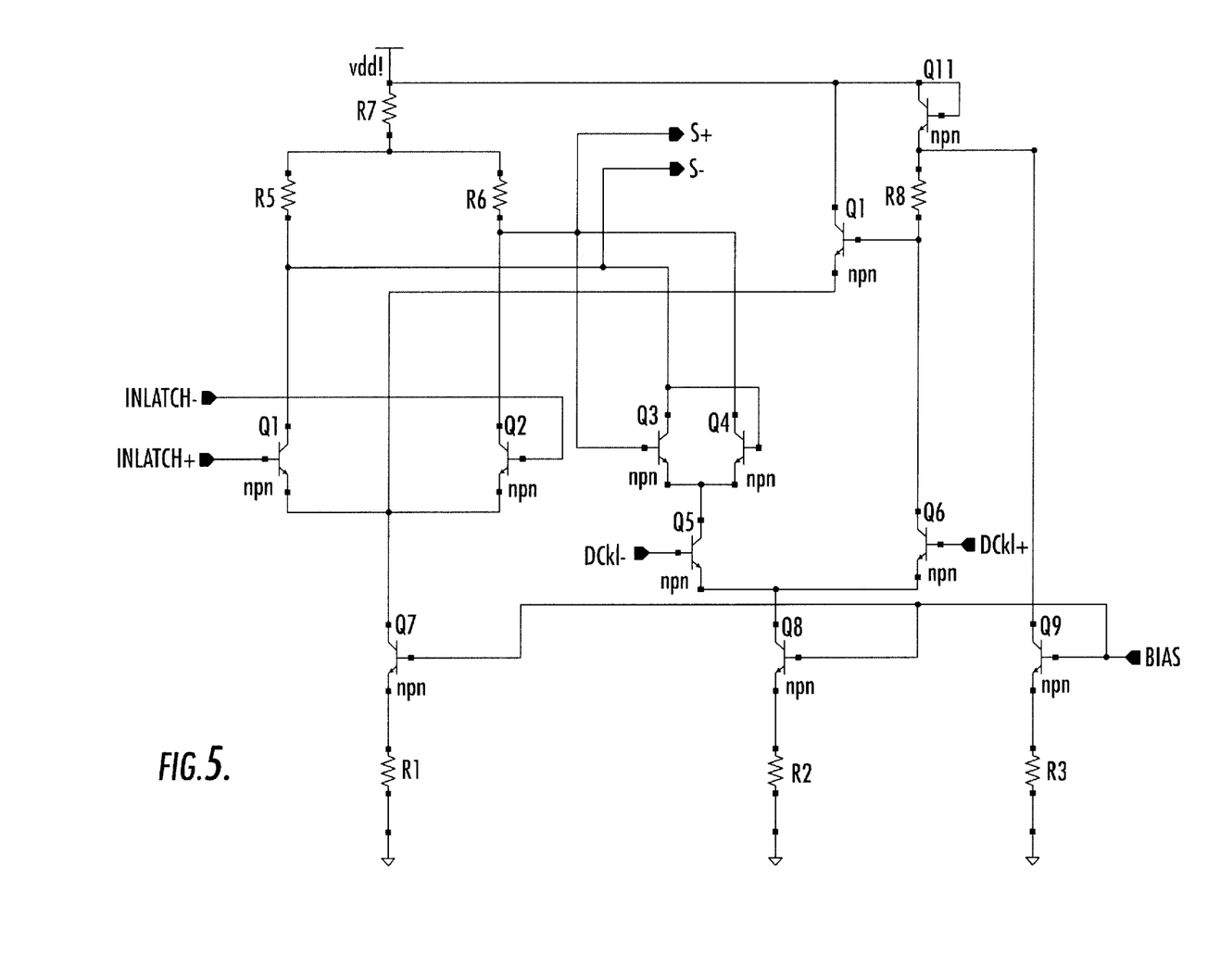
FIG. 5 shows a circuit diagram of an ECL latch used in the circuit according to the present invention.
Figure 6:
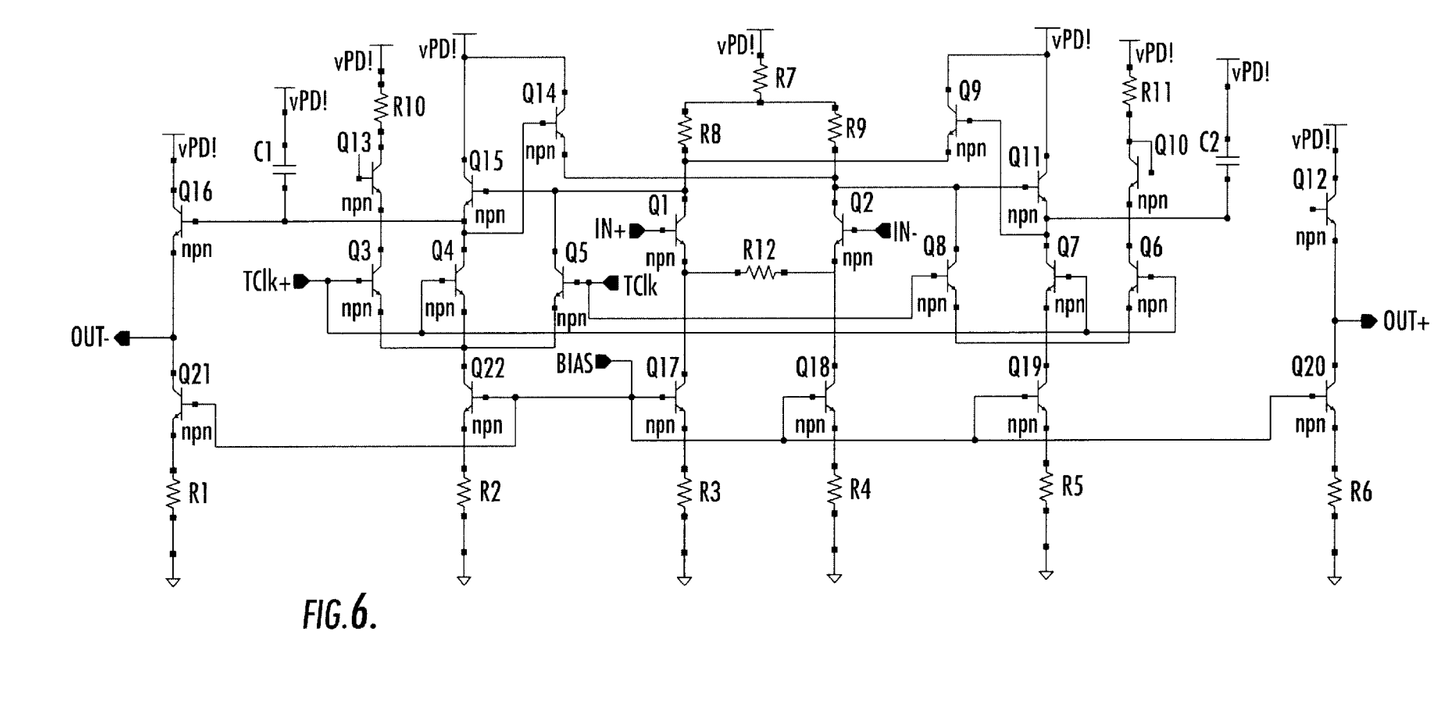
FIG. 6 shows a circuit diagram of a Track&Hold stage used in the circuit according to the present invention.

By way of example only and without any limitative signifiance, FIGS. 4, 5 and 6 show implementing circuits of the Analog-Amp MUX, LATCH-ECL and T&H blocks, respectively. The circuit diagrams of FIGS. 4, 5 and 6 are immediately readable by any person skilled in the electronic art and a detailed description of such practical embodiments of the functional circuits of the system of the invention appears superfluous for a complete understanding of the amplitude detector of the invention. Also to be considered is the use of different circuits as long as they perform the same function as required by the system of the invention.

Even the description of a practical implementation of a suitable timing block with the characteristics described in FIG. 2 is superfluous for a complete understanding of the system of the invention, because the generation of timing signals derived from master clock signals is a common practice in designing any digital systems. According to the practical application of FIG. 1, the master differential clock signal (Clk+, C−) is obtained from the frequency of the differential input signal, while the circuit of the invention will functionally substitute the AMPLITUDE DETECTOR block of the diagram of FIG. 1.

Figure 9:
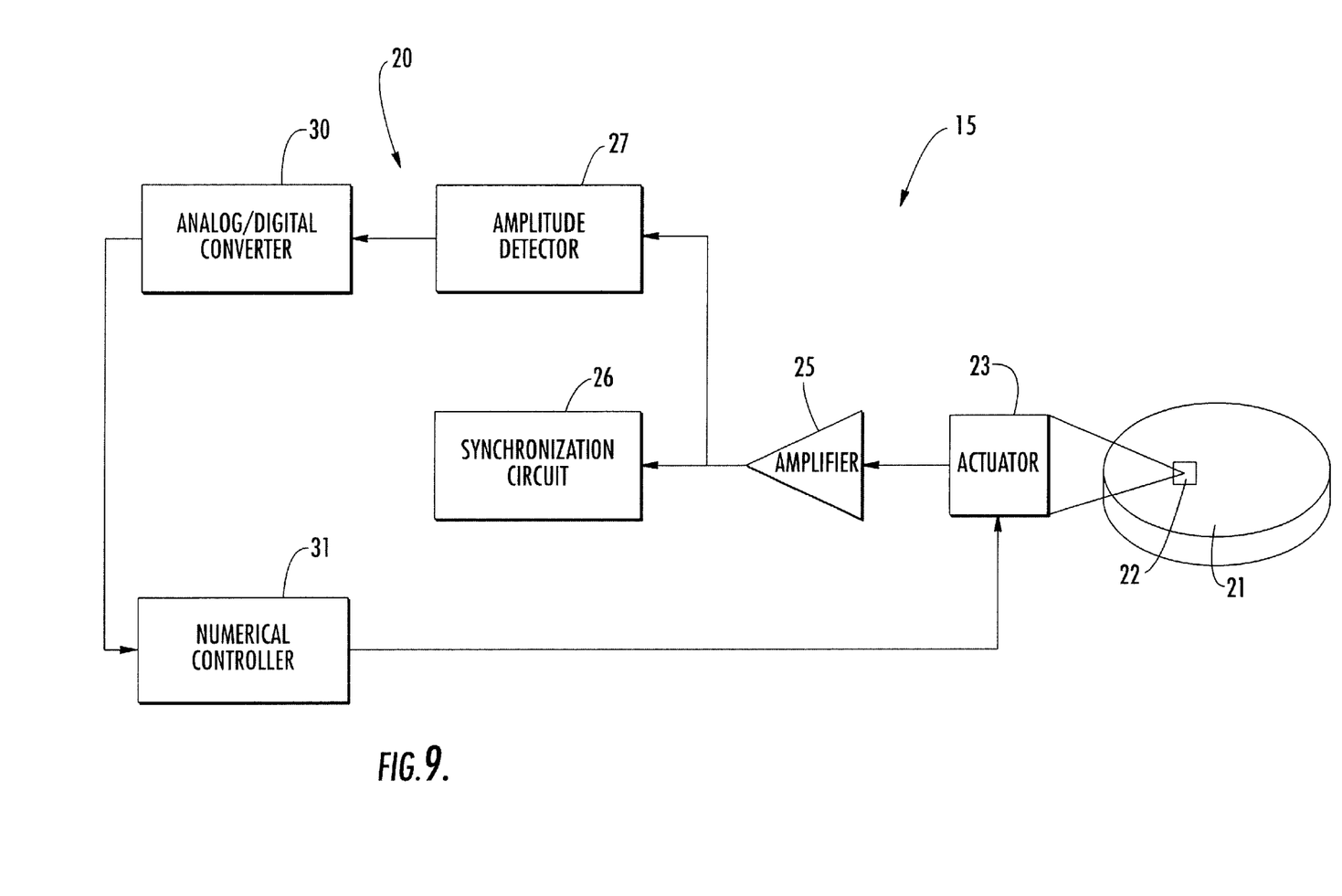
FIG. 9 is a block diagram illustrating a control loop for a hard disk drive according to the present invention.

As shown in FIG. 9, a control loop 20 for a hard disk drive 15 comprises a rotatable disk 21 storing data, a read/write head 22 scanning the rotatable disk, and an actuator 23 connected to the read/write head. The control loop comprises an amplification circuit 25 for amplifying an analog input signal from the read/write head 22, a synchronization circuit 26 for determining an operating frequency of the amplified input signal, and an amplitude detector circuit 27 receiving the amplified analog input signal. The control loop 20 also includes an analog/digital converter 30 connected to the amplitude detector circuit 27 for generating a digital value of the amplified analog input signal, and a numerical controller 31 positioning the actuator 23 responsive to the digital value of the amplified analog input signal.

The amplitude detector circuit 27 may comprise a circuit for monitoring an amplitude of the analog input signal. The monitoring circuit comprises a track and hold stage controlled by a first logic timing signal. The track and hold stage tracks the analog input signal during a tracking phase that corresponds to a first logic state of the first logic timing signal and produces an analog output signal that is representative of the analog input signal. The analog input signal is stored during a successive storing phase that corresponds to a second logic state of the first logic timing signal.

A bistable circuit is controlled by a second logic timing signal and includes an input coupled to the output of the track and hold stage. The bistable circuit produces a third logic control signal. A multiplexed amplifier is controlled by the third logic control signal and includes an input coupled to the output of the track and hold stage. The multiplexed amplifier outputs an analog output signal including an amplitude that is a function of an amplitude of the analog input signal.

That which is claimed:

1. A circuit for monitoring an amplitude of a differential analog signal, the circuit comprising:

a differential track and hold stage controlled by a first differential logic timing signal, said differential track and hold stage tracking a differential analog input signal during a tracking phase that corresponds to a first logic state of the first differential logic timing signal producing a first differential analog output signal that is representative of the differential analog input signal, and storing the differential analog input signal during a successive storing phase that corresponds to a second logic state of the first differential logic timing signal;

a differential output amplifier having inputs coupled to outputs of said differential track and hold stage producing an amplified differential output signal;

a differential bistable circuit, controlled by a second differential logic timing signal, and having inputs coupled to a differential output of said differential output amplifier, and producing a third differential logic control signal; and a multiplexed amplifier, controlled by the third differential logic control signal, and having inputs coupled to the outputs of said differential track and hold stage and outputting a second differential analog output signal having an amplitude that is a function of an amplitude of the differential analog input signal.

2. A circuit according to claim 1, further comprising a timing circuit receiving at an input a differential logic synchronizing signal and generating ii) therefrom the first differential logic timing signal for said differential track and hold stage and said second differential logic timing signal for said differential bistable circuit.

3. A circuit according to claim 1, wherein the first logic state of the first differential logic timing signal is a high logic state and the second logic state of the first differential logic timing signal is a low logic state.

4. A circuit for monitoring an amplitude of an analog signal, the circuit comprising:

a track and hold stage controlled by a first logic timing signal, said track and hold stage tracking a differential analog input signal during a tracking phase that corresponds to a first logic state of a first logic timing signal producing a first differential analog output signal that is representative of the differential analog input signal, and storing the differential analog input signal during a successive storing phase that corresponds to a second logic state of the first logic timing signal;

a bistable circuit, controlled by a second logic timing signal, and having an input coupled to an output of said track and hold stage, and producing a third logic control signal; and a multiplexed amplifier, controlled by the third logic control signal, and having an input coupled to the output of said track and hold stage and outputting a second differential analog output signal having an amplitude that is a function of an amplitude of the differential analog input signal.

5. A circuit according to claim 4, further comprising a first output amplifier connected between the output of said track and hold stage and the input of said bistable circuit, said first output amplifier producing an amplified output signal.

6. A circuit according to claim 4, further comprising a timing circuit receiving at an input a logic synchronizing signal and generating the first logic timing signal for said track and hold stage and the second logic timing signal for said bistable circuit.

7. A circuit according to claim 4, wherein the first logic state of the first logic timing signal is a high logic state and the second logic state of the first logic timing signal is a low logic state.

8. A control loop for a hard disk drive comprising at least one rotatable disk storing data, at least one read/write head scanning the at least one rotatable disk, an actuator connected to the at least one read/write head, the control loop comprising:

an amplification circuit for amplifying a differential analog input signal originating from the at least one read/write head;

a synchronization circuit for determining an operating frequency of the amplified differential analog input signal;

an amplitude detector circuit receiving the amplified differential analog input signal;

an analog/digital converter connected to said amplitude detector circuit for generating a digital value of the amplified differential analog input signal; and a numerical controller positioning the actuator responsive to the digital value of the amplified differential analog input signal;

said amplitude detector circuit comprising a circuit for monitoring an amplitude of the differential analog input signal, said circuit comprising a track and hold stage controlled by a first logic timing signal, said track and hold stage tracking the differential analog input signal during a tracking phase that corresponds to a first logic state of a first logic timing signal producing a first differential analog output signal that is representative of the differential analog input signal, and storing the differential analog input signal during a successive storing phase that corresponds to a second logic state of the first logic timing signal, a bistable circuit, controlled by a second logic timing signal, and having an input coupled to an output of said track and hold stage, and producing a third logic control signal, and a multiplexed amplifier, controlled by the third logic control signal, and having an input coupled to the output of said track and hold stage and outputting a second differential analog output signal having an amplitude that is a function of an amplitude of the differential analog input signal.

9. A control loop according to claim 8, further comprising a first output amplifier connected between the output of said track and hold stage and the input of said bistable circuit, said first output amplifier producing an amplified differential output signal.

10. A control loop according to claim 8, further comprising a timing circuit receiving at an input a logic synchronizing signal and generating the first logic timing signal for said track and hold stage and the second logic timing signal for said bistable circuit.

11. A control loop according to claim 8, wherein the first logic state of the first logic timing signal is a high logic state and the second logic state of the first logic timing signal a low logic state.

12. A hard disk drive comprising:

at least one rotatable disk storing data;

at least one read/write head scanning said at least one rotatable disk;

an actuator connected to said at least one read/write head; and a numerical controller positioning said actuator;

a control loop for controlling said numerical controller, said control loop comprising an amplification circuit for amplifying a differential analog input signal originating from said at least one read/write head, a synchronization circuit for determining an operating frequency of the amplified differential analog input signal, an amplitude detector circuit receiving the amplified differential analog input signal, and an analog/digital converter connected to said amplitude detector circuit for generating a digital value of the amplified differential analog input signal for said numerical controller, said amplitude detector circuit comprising a circuit for monitoring an amplitude of the differential analog input signal, said circuit comprising a track and hold stage controlled by a first logic timing signal, said track and hold stage tracking the differential analog input signal during a tracking phase that corresponds to a first logic state of a first logic timing signal producing a first differential analog output signal that is representative of the differential analog input signal, and storing the differential analog input signal during a successive storing phase that corresponds to a second logic state of the first logic timing signal, a bistable circuit, controlled by a second logic timing signal, and having an input coupled to an output of said track and hold stage, and producing a third logic control signal, and a multiplexed amplifier, controlled by the third logic control signal, and having an input coupled to the output of said track and hold stage and outputting a second differential analog output signal having an amplitude that is a function of an amplitude of the differential analog input signal.

13. A hard disk drive according to claim 12, further comprising a first output amplifier connected between the output of said track and hold stage and the input of said bistable circuit, said first output amplifier producing an amplified differential output signal.

14. A hard disk drive according to claim 12, further comprising a timing circuit receiving at an input a logic synchronizing signal and generating the first logic timing signal for said track and hold stage and the second logic timing signal for said bistable circuit.

15. A hard disk drive according to claim 12, wherein the first logic state of the first logic timing signal is a high logic state and the second logic state of the first logic timing signal is a low logic state.

16. A method for monitoring an amplitude of an analog signal, the method comprising the steps of:

tracking a differential analog input signal during a tracking phase that corresponds to a first logic state of a first logic timing signal;

producing a first differential analog output signal that is representative of the differential analog input signal;

storing the differential analog input signal during a successive storing phase that corresponds to a second logic state of the first logic timing signal;

producing a third logic control signal responsive to the first differential analog output signal; and producing a second differential analog output signal having an amplitude that is a function of an amplitude of the differential analog input signal, the second differential analog output signal being produced responsive to the third logic control signal and the first differential analog output signal.

17. A method according to claim 16, further comprising amplifying the first differential analog output signal before the step of producing the third logic control signal.

18. A method according to claim 16, further comprising generating the first logic timing signal and the second logic timing signal responsive to a logic synchronizing signal.

19. A method according to claim 16, wherein the first logic state of the first logic timing signal is a high logic state and the second logic state of the first logic a timing signal is a low logic state.

\* \* \* \* \*

UNITED STATES PATENT AND TRADEMARK OFFICE
CERTIFICATE OF CORRECTION

PATENT NO. : 6,654,192 B1  Page 1 of 1
DATED : November 25, 2003
INVENTOR(S) : Bruccoleri et al.

It is certified that error appears in the above-identified patent and that said Letters Patent is hereby corrected as shown below:

Column 3,
Line 4, delete "(TClk+ and TC-)" insert -- (TClk+ and TClk-) --
Lines 12 and 38, delete "(DClk+, DC-)" insert -- (DClk+, DClk-) --
Line 18, delete "(S+,S-)=(IN+,IN)*(At&h*Aamp*Alatch)." insert
-- (S+,S-)=(IN+,IN-)*(At&h*Aamp*Alatch). --
Line 21, delete "in" insert -- is --
Line 32, delete "(TClk+, TC-)" insert -- (TClk+, TClk-) --
Line 43, delete "DC-)" insert -- DClk-) --
Line 56, delete "is" insert -- it --

Column 4,
Line 16, delete "(Clk+, C-)" insert -- (Clk+, Clk-) --

Column 5,
Line 14, delete "ii) therefrom"

Column 6,
Line 45, insert -- is-- between "signal" and "a"

Signed and Sealed this

Twenty-third Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,654,192 B1
DATED         : November 25, 2003
INVENTOR(S)   : Bruccoleri et al.

It is certified that error appears in the above-identified patent and that said Letters Patent is hereby corrected as shown below:

Column 3,
Line 38, delete "(DC1R+, DC-)" and replace with -- (DCIR+, DC1K-) --

Signed and Sealed this

Twenty-first Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,654,192 B1
DATED : November 25, 2003
INVENTOR(S) : Bruccoleri et al.

It is certified that error appears in the above-identified patent and that said Letters Patent is hereby corrected as shown below:

Column 3,
Line 4, delete "(TClk+ and TC-)" insert -- (TClk+ and TClk-) --
Lines 12 and 38, delete "(DClk+, DC-)" insert -- (DClk+, DClk-) --
Line 18, delete "(S+,S-)=(IN+,IN)*(At&h*Aamp*Alatch)." insert
-- (S+,S-)=(IN+,IN-)*(At&h*Aamp*Alatch). --
Line 21, delete "in" insert -- is --
Line 32, delete "(TClk+, TC-)" insert -- (TClk+, TClk-) --
Line 43, delete "DC-)" insert -- DClk-) --
Line 56, delete "is" insert -- it --
Line 38, delete "(DClK+, DC-)" and insert -- (DClK+,DClk-) --

Column 4,
Line 16, delete "(Clk+, C-)" insert -- (Clk+, Clk-) --

Column 5,
Line 14, delete "ii) therefrom"

Column 6,
Line 45, insert -- is-- between "signal" and "a"

This certificate supersedes Certificate of Corrections March 23, 2004.

Signed and Sealed this

Tenth Day of May, 2005

JON W. DUDAS
*Acting Director of the United States Patent and Trademark Office*